United States Patent
Romig et al.

(10) Patent No.: US 9,768,130 B2
(45) Date of Patent: Sep. 19, 2017

(54) INTEGRATED POWER PACKAGE

(71) Applicant: Texas Instruments Incorporated, Dallas, TX (US)

(72) Inventors: Matthew David Romig, Wylie, TX (US); Christopher Daniel Manack, Lantana, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/923,123

(22) Filed: Oct. 26, 2015

(65) Prior Publication Data
US 2017/0117238 A1    Apr. 27, 2017

(51) Int. Cl.
*H01L 23/34*     (2006.01)
*H01L 23/58*     (2006.01)
*H01L 21/50*     (2006.01)

(52) U.S. Cl.
CPC ............ *H01L 23/58* (2013.01); *H01L 21/50* (2013.01)

(58) Field of Classification Search
CPC ..... H01L 21/4871; H01L 21/50; H01L 23/10; H01L 23/58

USPC ............... 257/686, 706, 707, 713, 724, 777
See application file for complete search history.

(56) References Cited

U.S. PATENT DOCUMENTS

| | | | |
|---|---|---|---|
| 7,671,462 B2* | 3/2010 | Sakamoto | H01L 23/49844 257/691 |
| 7,800,208 B2* | 9/2010 | Otremba | H01L 23/3107 257/678 |
| 2012/0292753 A1* | 11/2012 | Cho | H01L 24/37 257/676 |

* cited by examiner

*Primary Examiner* — Hung Vu
(74) *Attorney, Agent, or Firm* — Jacqueline J. Garner; Charles A. Brill; Frank D. Cimino

(57) ABSTRACT

An integrated power package includes a substrate having a first surface and an integrated circuit located within the substrate. At least one electrical conductor is located between the first surface and another point on the substrate. At least one transistor is electrically and mechanically coupled to the at least one first conductor. A support structure is electrically and mechanically coupled to the at least one transistor, wherein the at least one transistor is located between the first surface of the substrate and the support structure.

11 Claims, 2 Drawing Sheets

INTEGRATED POWER PACKAGE

BACKGROUND

Integrated power packages conduct high current and require good thermal performance in a small footprint in order to be placed in small electronic devices. Many integrated power packages lack the ability to place integrated circuits (ICs) in a vertical stack with high-current transistors, such as MOSFETs because the thermal performance is degraded by such placements.

Many of the conventional integrated power packages do not have exposed metal on top of the packages, which reduces the thermal performance of the MOSFETs and the controllers. Furthermore, conventional packages use the same process step to interconnect the controller and the MOSFETs, which results in degraded electrical performance.

SUMMARY

An integrated power package includes a substrate having a first surface and an integrated circuit located within the substrate. At least one electrical conductor is located between the first surface and another point on the substrate. At least one transistor is electrically and mechanically coupled to the at least one first conductor. A support structure is electrically and mechanically coupled to the at least one transistor, wherein the at least one transistor is located between the first surface of the substrate and the support structure.

DETAILED DESCRIPTION

Figure 1:
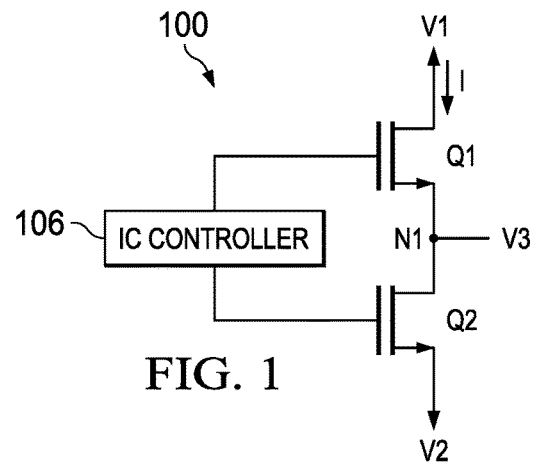
FIG. 1 is a schematic diagram of a high current circuit.

Devices are disclosed herein that enable placement of high power transistors proximate integrated circuits that may control the operation of the transistors, wherein the transistors are located side by side. FIG. 1 is a schematic diagram of a high current circuit 100 wherein current I flows through a first FET Q1 and a second FET Q2. While FETs are described herein, the circuit 100 may substitute the FETs with other types of transistors. The current I flows between a first voltage V1 and a second voltage V2. A node N1 located between the first FET Q1 and the second FET Q2 has a voltage V3. The gates of the first and second FETs Q1 and Q2 are coupled to an IC controller 106 that controls the gate voltages and the current flow through the first and second FETs Q1 and Q2. The current I flowing through the first and second FETs Q1 and Q2 generates heat that may interfere with the operation of the IC controller 106. Furthermore, the current I may be too high to pass through the IC controller 106. Accordingly, the first and second FETs Q1 and Q2 are typically located external to the IC controller 106. The circuits and structures described herein enable the IC controller 106 to be located proximate the first and second FETs Q1 and Q2 in an integrated power package that provides for heat dissipation. The transistors described with reference to FIG. 1 are exemplary and other configurations may be applied, such as different P-channel and N-channel devices.

Figure 2:
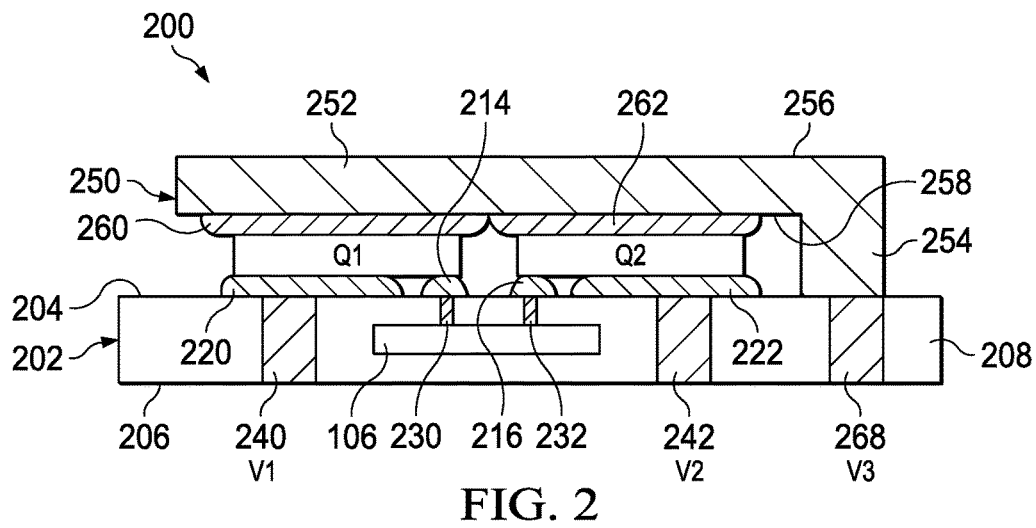
FIG. 2 is a side cutaway view of an example of an integrated power package for the circuit of FIG. 1.
Figure 3:
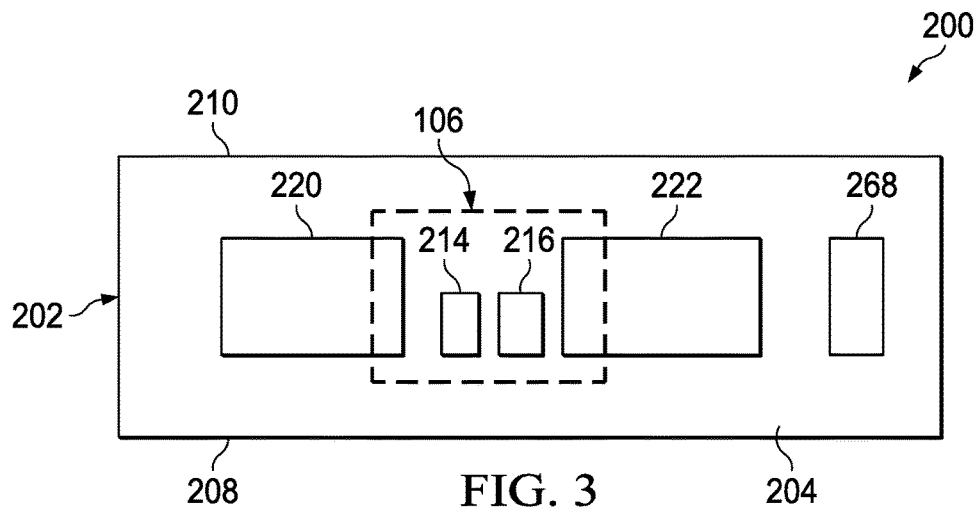
FIG. 3 is a top plan view of the substrate of the integrated power package of FIG. 2.

FIG. 2 is a side cutaway view of an example of an integrated power package 200 for the circuit 100 of FIG. 1 and FIG. 3 is a top plan view of the package 200. The package 200 includes a dielectric structure 202 wherein the IC controller 106 is attached to the dielectric structure 202. The dielectric structure 202 includes a plurality of conductors that are described below. In the example of FIG. 2, the IC controller 106 is located within the dielectric structure 202, but in other examples, the IC controller 106 is attached to other portions or surfaces of the dielectric structure 202. In yet other examples, the IC controller 106 is located in other positions within the dielectric structure 202. The dielectric structure 202 is fabricated from material that is substantially electrically insulating, such as dielectric materials commonly used in the fabrication of IC packages. Dielectric materials include polymer based materials.

The dielectric structure 202 includes a top surface 204, which is sometimes referred to as a first surface, and a bottom surface 206, which is sometimes referred to as a second surface. In addition, the dielectric structure 202 includes a front surface 208 and a rear surface 210. A first gate pad 214 and a second gate pad 216 are located on the top surface 204 of the dielectric structure 202. The pads described herein are illustrated with a bonding material located thereon. The first gate pad 214 serves as a conductor for the gate of the first FET Q1, FIG. 1, and the second gate pad 216 serves as a conductor for the gate of the second FET Q2. The first gate pad 214 and the second gate pad 216 may be solder pads that electrically and mechanically couple electronic components to substrates and other structures. A first source pad 220 and a second drain pad 222 are also located on the top surface 204 of the dielectric structure 202. In the configuration of the IC package 200, the first FET Q1 is placed source down on the first source pad 220 and the second FET Q2 is placed drain down on the second drain pad 222. In other embodiments, the FETs may have other configurations relative to the dielectric structure 202. The first source pad 220 and the second drain pad 222 may be solder pads that electrically and mechanically connect electronic components to substrates. The first source pad 220 and the second drain pad 222 may have thermal and electrical properties described herein.

The dielectric structure 202 includes a plurality of conductors that electrically connect the pads to external contacts and to the IC controller 106. The conductors shown in FIGS. 2 and 3 are for illustration purposes only and other conductor configurations may be located within the dielectric structure 202. A first gate conductor 230 couples the first gate pad 214 to the IC controller 106 and a second gate conductor 232 couples the second gate pad 216 to the IC controller 106. The first gate conductor 230 and the second gate conductor 232 conduct the gate current between the first and second FETS Q1 and Q2 and the IC controller 106. Because the first and second gate conductors 230 and 232 conduct gate currents, the current flow is relatively low, so the first and second gate conductors 230 and 232 may be relatively small. Other low current conductors (not shown) may be located within the dielectric structure 202 to couple external connectors to the IC controller 106.

Other conductors within the dielectric structure 202 serve to conduct the current I, shown in FIG. 1, through the first FET Q1 and the second FET Q2. A first source conductor 240 conducts current between a point external to the dielectric structure 202 and the first source pad 220. A second drain conductor 242 conducts current between a point external to the dielectric structure 202 and the second drain pad 222. The external points described herein are shown as being on the bottom surface 206 of the dielectric structure 202; however, the external points may be located anywhere on the dielectric structure 202. The conductors 240 and 242 are fabricated from a low resistance material and are large enough to accommodate the current I so as to minimize losses as the current I flows through the conductors 240 and 242. In some examples, the current I may be in the range of 1.0 to 100 Amps. In such embodiments, the conductors 240 and 242 should be less than 10 mΩ of resistance, and in some examples the resistance is less than 1.0 mΩ.

The first FET Q1 is electrically and mechanically coupled to the first gate pad 214 and the first source pad 220. More specifically, the gate of the first FET Q1 is electrically and mechanically coupled to the first gate pad 214 and the source is electrically and mechanically coupled to the first source pad 220. The second FET Q2 is electrically and mechanically coupled to the second gate pad 216 and the second drain pad 222. More specifically, the gate of the second FET Q2 is electrically and mechanically coupled to the second gate pad 216 and the drain is electrically and mechanically coupled to the second drain pad 222. In some examples the material bonding the FETS Q1 and Q2 to their respective pads has a thermal conductivity of greater than five watts per meter-Kelvin (W/mK) and an electrical resistivity of less than 500 micro-Ohm-cm (uΩcm) and has a thickness between 10 and 100 microns.

Figure 4:
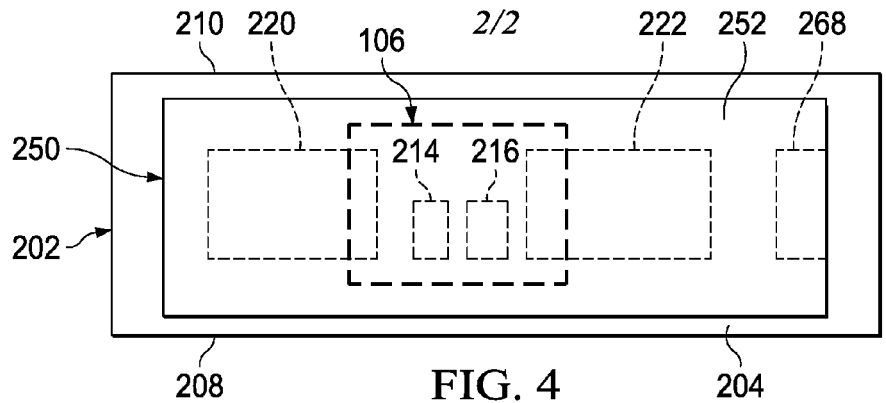
FIG. 4 is a top plan view of the integrated power package of FIG. 2.

With additional reference to FIG. 4, conductor 250 is electrically and mechanically coupled to both the first FET Q1 and the second FET Q2. The conductor 250 is sometimes referred to as a, "support structure". In the embodiment of FIG. 2, the conductor 250 has a horizontal portion 252 and a vertical portion 254. The current I flows through the horizontal portion 252, so the material of the horizontal portion 252 is such that it can accommodate the current I and electrically and mechanically couple to both FETS Q1 and Q2. For example, the conductor 250 may be fabricated from copper or a similar material, and may have a thickness of 0.025 mm to 0.5 mm. The horizontal portion 252 has a top surface 256, which is sometimes referred to as a first surface, and a bottom surface 258, which is sometimes referred to as a second surface. The bottom surface 258 has a first drain pad 260 and a second source pad 262 that electrically and mechanically couple the first and second FETS Q1 and Q2 to the horizontal portion 252. The horizontal portion 252 may also serve to dissipate heat from the package 200. For example, the horizontal portion 252 may be larger than the first and second FETs Q1 and Q2 by 0.5 mm to 5 mm when viewed from the top plan view of FIG. 4. Accordingly, the horizontal portion 252 may extend beyond the footprints of the first and second FETS Q1 and Q2, which enables heat to be transferred from the first and second FETS Q1 and Q2 and to the horizontal portion 252. The heat may then be transferred away from the package 200 by way of the horizontal portion 252. The specific thickness, content, and size of the support structure 250 as well as the electrical and mechanical interconnection are selected in order to sufficiently conduct away the heat generated by the first and second FETs Q1 and Q2.

In some examples, the vertical portion 254 secures the conductor 250 to the dielectric structure 202 and couples the voltage V3 to the dielectric structure 202. The potential of the conductor 250 is the voltage V3 of FIG. 1. In the example of FIG. 2, the potential is conducted to the bottom surface 206 of the dielectric structure 202 by way of a conductor 268. In some examples of the circuit 100 of FIG. 1, the current I flows through the conductor 268, so it may be fabricated in a manner to accommodate the current I with minimal loss. The material coupling the first and second FETS Q1 and Q2 to the conductor 250 may be the same or have the same electrical and/or thermal characteristics as the material coupling the first and second FETS Q1 and Q2 to the pads 220 and 222.

As shown in FIG. 4, the horizontal portion 252 of the conductor 250 extends in a manner to cover both FETS Q1 and Q2 so as to provide efficient heat transfer and to accommodate the current I, FIG. 1. For example, the horizontal portion 252 may be a metal device that conducts heat and it may be exposed to the exterior of the package 200. Heat sinks or other devices or methods for transferring heat from the horizontal portion 252 may be placed proximate the horizontal portion 252 when the package 202 is in use.

The package 200 has many advantages over conventional packages. For example, the package 200 has the first and second FETS Q1 and Q2 located on top of the IC controller 106, which reduces the size of the package 200. Additionally, the package 200 may have the horizontal portion 252 of the conductor 250 exposed, which enhances the thermal performance of the package 200.

The fabrication techniques for the package 200 provide further enhancements over conventional packages. The dielectric structure 202 is fabricated with the IC controller 106 and the conductors located therein. The first FET Q1 and the second FET Q2 are electrically and mechanically coupled to the bottom surface 258 of the horizontal portion 252. In some examples, solder or an epoxy having the electrical and thermal properties described above is used to couple the FETS Q1 and Q2. The combination of the conductor 250 and the FETS Q1 and Q2 is then placed onto the top surface 204 of the substrate 202 so that the FETS Q1 and Q2 contact their appropriate pads on the top surface 204 of the dielectric structure 202. In other examples, the FETS Q1 and Q2 are coupled to the top surface 204 of the dielectric structure 202 and the conductor 250 is subsequently coupled to the FETS Q1 and Q2 and the dielectric structure 202.

Figure 5:
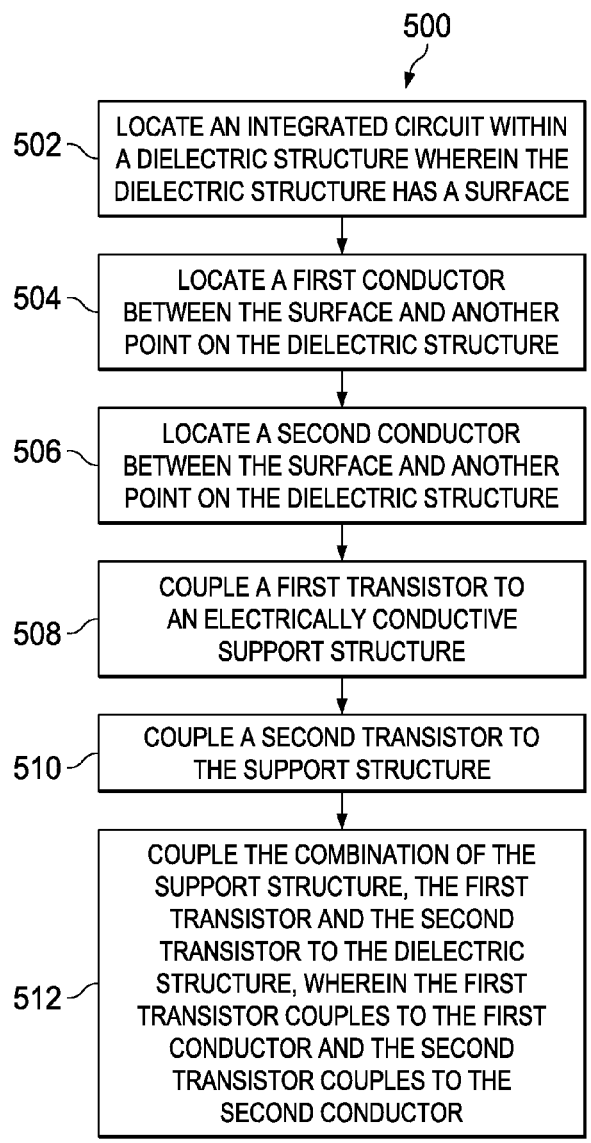
FIG. 5 is a flow chart describing an example fabrication method for the integrated power package of FIG. 2.

An example of fabricating the package 200 is described by the flow chart 500 of FIG. 5. Step 502 includes locating an integrated circuit within a dielectric structure wherein the dielectric structure has a surface. Step 504 includes locating a first conductor between the surface and another point on the dielectric structure. Step 506 includes locating a second conductor between the surface and another point on the dielectric structure. Step 508 includes coupling a first transistor to an electrically conductive support structure. Step 510 includes coupling a second transistor to the support structure. Step 512 includes coupling the combination of the support structure, the first transistor and the second transistor to the dielectric structure, wherein the first transistor couples to the first conductor and the second transistor couples to the second conductor.

Certain embodiments of integrated power packages and fabrication methods have been expressly described in detail herein. Alternative embodiments will occur to those skilled in the art after reading this disclosure. The claims are intended to be broadly construed to cover all such alternative embodiments, except as limited by the prior art.

What is claimed is:

1. An integrated power package comprising:
   a dielectric structure having a first surface and an opposite second surface;

an integrated circuit located within the dielectric structure;

a plurality of conductors comprising a first set of conductors and a second set of conductors, the first set of conductors extending from the first surface to the opposite second surface and the second set of conductors extending from the first surface and coupled to the integrated circuit;

a first transistor and a second transistor coupled to the plurality of conductors, portions of the first transistor and the second transistor overlapping with portions of the integrated circuit as projected perpendicular onto the first surface; and a support structure coupled to the first transistor and the second transistor, wherein the first transistor and the second transistor are located between the first surface of the dielectric structure and the support structure.

2. The package of claim 1, wherein the support structure has a thickness of between 0.025 mm and 0.5 mm.

3. The package of claim 1, wherein the first transistor and the second transistor are coupled to the plurality of conductors via a material having a thermal conductivity of greater than five watts per meter-Kelvin (W/mK).

4. The package of claim 1, wherein the first transistor and the second transistor are coupled to the plurality of conductors via a material having an electrical resistivity of less than 500 micro-Ohm-Cm (uΩCm).

5. The package of claim 1, wherein the first transistor includes a first drain pad, a first source pad, and a first gate pad, wherein the first drain pad is coupled to the support structure, the first source pad is coupled to a first conductor of the first set of conductors, and the first gate pad is coupled to a first conductor of the second set of conductors.

6. The package of claim 1, wherein the second transistor includes a second drain pad, a second source pad, and a second gate pad, wherein the second source pad is coupled to the support structure, the second drain pad is coupled to a second conductor of the first set of conductors, and the second gate pad is coupled to a second conductor of the second set of conductors.

7. The package of claim 1, wherein the footprint of the support structure is greater than combined footprints of the first transistor and the second transistor.

8. The package of claim 1, wherein the footprint of the support structure is at least 0.5 mm greater than combined footprints of the first transistor and the second transistor.

9. The package of claim 1, wherein the support structure completely covers the first transistor and the second transistor.

10. The package of claim 1, wherein the support structure is coupled to a third conductor of the first set of conductors.

11. The package of claim 1, wherein the support structure is of electrically conductive material.

* * * * *